United States Patent [19]

Wilson et al.

[11] 4,224,535
[45] Sep. 23, 1980

[54] EFFICIENT BASE DRIVE CIRCUIT FOR HIGH CURRENT TRANSISTORS

[75] Inventors: James W. A. Wilson; Robert L. Steigerwald, both of Scotia, N.Y.

[73] Assignee: General Electric Company, Schenectady, N.Y.

[21] Appl. No.: 931,907

[22] Filed: Aug. 8, 1978

[51] Int. Cl.² ............................................ H03K 17/60
[52] U.S. Cl. .................................. 307/270; 307/255; 307/254
[58] Field of Search ............... 307/270, 254, 253, 255, 307/315

[56] References Cited

U.S. PATENT DOCUMENTS

| | | | |
|---|---|---|---|
| 3,206,651 | 9/1965 | Proulx | 307/254 |
| 3,244,910 | 4/1966 | Leifer | 307/254 |
| 3,293,495 | 12/1966 | Smith | 307/254 |
| 3,573,502 | 4/1971 | Kan | 307/270 |

*Primary Examiner*—Stanley D. Miller, Jr.
*Assistant Examiner*—B. P. Davis
*Attorney, Agent, or Firm*—Robert B. Levy; James C. Davis; Marvin Snyder

[57] ABSTRACT

A high current switching transistor controlling a load in its collector circuit receives from a drive circuit sufficient base current necessary to render the transistor conductive. A low loss inductor and switching means are connected to the base of the transistor such that when switching means are rendered nonconductive, current from the inductor flows into the base of the transistor to render it conductive, thus energizing the load.

Regulating means coupled between a source of relatively high DC potential and the inductor together with unidirectional feedback path means provide a continuous current into the inductor such that when regulating means are substantially nonconductive, current is diverted away from the base of the high current transistor and circulates through the unidirectional feedback path and low loss inductor.

7 Claims, 2 Drawing Figures

EFFICIENT BASE DRIVE CIRCUIT FOR HIGH CURRENT TRANSISTORS

FIELD OF THE INVENTION

This invention relates to transistor drive circuits and more specifically to a transistor drive circuit capable of providing sufficient base current to saturate a high current transistor with little power loss.

BACKGROUND OF THE INVENTION

In various circuit applications where the control of current to a load connected across the DC voltage source is to be maintained, it is often desirable to connect a high current switching transistor is series with the load to achieve control of current therethrough. Applying a voltage of sufficient magnitude to the base of the high current transistor causes the high current transistor to be conductive and permits a current to flow between the collector and emitter terminals, thereby permitting current to flow through the load. Control of the load voltage and current through the load is achieved by control of the switching of the high current transistor.

In circuits operated in this manner, usually a single, relatively high, DC potential source is available. It is, therefore, necessary to provide some means to reduce this potential so that an appropriate value of DC potential may be applied across the base-emitter junction of the high current transistor.

In the past, apparatus such as DC-DC converters or voltage dividers have been employed to provide appropriate base voltage to control the high current transistor. In one such circuit according to the prior art of which the inventors are aware, a voltage divider network comprised of a resistor and a control transistor in series is connected across a DC voltage source with the base of the high current transistor connected to the junction of the resistor and the collector of the control transistor. Typically, the load in this prior art circuit is serially connected with the collector of the high current transistor across the DC source and is controlled by causing the control transistor to alternate between a nonconductive and a conductive condition. When the control transistor is forced into being conductive, current will flow through the resistor and the collector electrode of the control transistor. With current flow through the collector of the control transistor, the corresponding base-emitter potential of the high current transistor will be relatively low, causing the high current transistor to be nonconductive and thus causing the load to remain de-energized When the control transistor is nonconductive, the base-emitter potential developed across the high current transistor will be high, rendering the transistor conductive and thus permitting load current to flow through the collector electrode. A major disadvantage in such a circuit is that current continuously flows in resistor 110. This results in substantial undesirable power losses.

SUMMARY OF THE PRESENT INVENTION

Briefly, in accordance with a preferred embodiment of the present invention an efficient base drive circuit for a high current transistor comprises inductor means connected to the base of a high current transistor for providing current thereto so as to cause the high current transistor to be conductive during selected intervals. Switching means connected to the junction of the inductor means and the base of a high current transistor serve to divert DC current from the inductor means away from the base of the high current transistor when the high current transistor is to be nonconductive at other than the selected intervals. Regulating means are connected between a relatively high source of DC potential and the inductor means for controlling the current amplitude through the inductor means. The regulating means are switched into and out of conduction at a predetermined ratio of time intervals. By suitably adjusting the on-off time ratio, the regulating means can be made to maintain either a constant current flow through the inductor means or a continuous current flow proportional to the collector current within the high current transistor.

Unidirectional conduction means are connected across the series combination of the inductor means and the switching means to maintain a continuous current flow through the inductor means when the regulating means are switched out of conduction.

BRIEF DESCRIPTION OF THE DRAWINGS

The features of the invention believed to be novel are set forth with particularity in the appended claims. The invention itself, however, as both to organization and method of operation together with further objects and advantages thereof may best be understood by reference to the following description taken in conjunction with the accompanying drawings in which:

DETAILED DESCRIPTION OF THE PREFERRED EMBODIMENT

Figure 1:
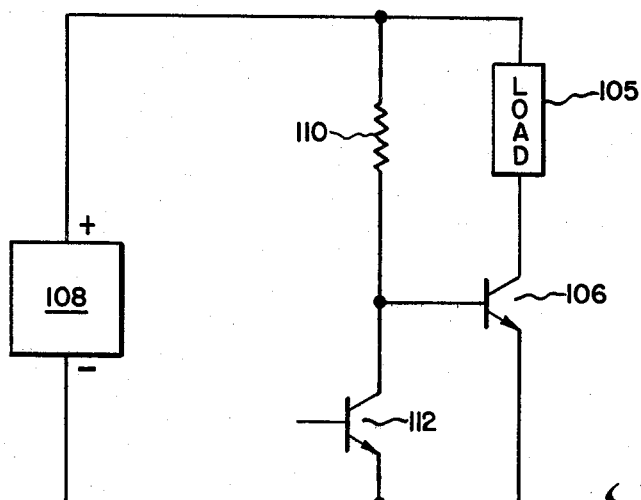
FIG. 1 is a schematic representation of a base drive circuit according to the prior art using a voltage divider network to provide base drive current.

In FIG. 1 a prior art base drive circuit is shown. A load 105 is serially connected to the collector of a high current NPN transistor 106 across a DC source 108 such that one terminal of the load is connected to the positive DC source terminal and the emitter of transistor 106 is connected to the negative DC source terminal. A voltage divider network to provide sufficient base current to transistor 106 includes a resistor 110 coupled between the positive terminal of the DC source and the base of transistor 106 and a control transistor 112 having its collector connected to the base of transistor 106 and the emitter connected to the negative DC source terminal.

The high current transistor 106 which controls current through load 105 is, in turn, controlled by NPN control transistor 112. Thus, if sufficient base-emitter potential is applied to control transistor 112, current will flow through resistance 110 and into the collector electrode of control transistor 112. As the base emitter potential of transistor 106 corresponds to the collector-emitter potential of control transistor 112, when transistor 112 is conductive, the base-emitter potential transistor 106 will be low and hence the transistor 106 will be substantially nonconductive. When transistor 106 is nonconductive, essentially no load current will flow through load 105 and it will remain de-energized.

If, however, insufficient base emitter potential is present at control transistor 112 to cause it to conduct, a correspondingly high base-emitter potential will be present at transistor 106, thus causing transistor 106 to be rendered conductive. Current will thereupon flow into the collector of transistor 106 through load 105 thus energizing the load.

As noted above, when load 105 is to be de-energized, transistor 112 is forced into conduction. In either case substantial current flows through resistance 110 generating substantial power loss.

Figure 2:
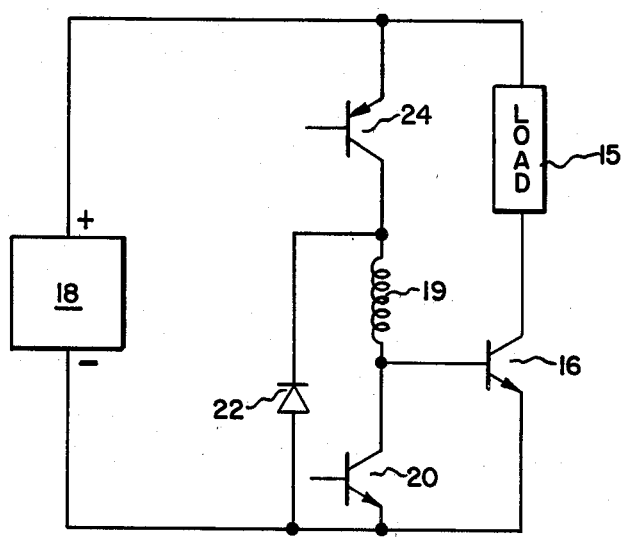
FIG. 2 is a schematic representation of an efficient base drive circuit for a high current transistor in accordance with the teachings of the present invention.

In FIG. 2 there is shown a base drive circuit according to the present invention. As with the base drive circuit of FIG. 1, a load 15 is serially connected to the collector of a high current NPN transistor 16 across source of DC potential 18 such that the one terminal of the load is connected to the positive terminal of DC source 18 while the emitter of transistor 16 is connected to the negative terminal of source 18.

The output side of low resistance inductor 19 is coupled to the base of high current transistor 16 and to the collector of an NPN switching transistor 20. The cathode of a recirculating diode 22 is coupled to the input side of inductor 19 while the anode is coupled to the junction of the negative DC source terminal and the emitter of transistor 20.

Regulating means 24, shown as a PNP transistor having an emitter terminal coupled to the positive terminal of source 18 and a collector terminal connected to the input side of inductor 19, serves to control the amplitude of the current produced by inductor 19 so as to maintain a desired base current to transistor 16. By suitably adjusting the average current flow through transistor 24, as by pulsing it on and off at an appropriate on/off time ratio, the current through inductor 19 can be made either constant or proportional to collector current of transistor 16.

In operation, to energize load 15, transistor 20 remains substantially nonconductive by the absence of a sufficient base emitter potential. With transistor 20 substantially nonconductive, current flowing through inductor means 19 will flow into the base of transistor 16 generating a sufficient base emitter potential to render transistor 16 substantially conductive. With transistor 16 conductive, current will flow into the collector eletrode, energizing load 15. To de-energize load 15, sufficient base-emitter potential is applied to transistor 20 to render it conductive. With transistor 20 conductive, a low impedance path will be developed across the collector-emitter portion thereof, diverting current away from the base of the high current transistor 16, rendering transistor 16 substantially nonconductive. If transistor 24 is substantially nonconductive as occurs during predetermined time intervals, current from inductor 19 will circulate through a loop defined by inductor 19 the collector-emitter portion of transistor 20, and forward biased diode 22. Thus, in comparison with the circuit of FIG. 1, when load 15 in the circuit of FIG. 2 is de-energized, only small power losses will be generated owing to the relatively low resistance of the circuit.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What is claimed is:

1. An efficient base drive circuit for providing base current to a high current transistor from a source of relatively high DC potential, comprising:
   inductor means connected to the base of a high current transistor for providing current thereto so as to cause said high current transistor to be conductive during selected time intervals;
   switching means connected to the junction of said inductor means and the base of said high current transistor for diverting current away from the base of said high current transistor at other than said selected time intervals so as to cause said high current transistor to be substantially nonconductive during other than said selected time intervals;
   regulator means connected between the DC source potential and said inductor means for controlling current amplitude through said inductor means, said regulator means being switched into and out of conduction at a predetermined ratio of time intervals; and
   unidirectional conduction means connected across the series combination of said inductor means and said switching means so as to maintain uninterrupted current flow through said inductor means when said regulator means are switched out of conduction.

2. The invention according to claim 1, wherein said switching means comprises a switching transistor having a collector electrode connected to the base of said high current transistor and an emitter electrode connected to said emitter electrode of the high current transistor.

3. The invention according to claim 2, wherein said unidirectional conduction means comprise a diode having an anode electrode connected to the emitter of said switching transistor and a cathode connected to said inductor means.

4. The invention according to claim 1, wherein said regulator means comprise:
   a PNP transistor having an emitter electrode connected to a positive DC source terminal and a collector electrode connected to said inductor means, said transistor being switched in and out of conduction by a time-variant signal impressed on the base of said transistor.

5. An efficient base drive circuit for supplying sufficient current to drive a high current transistor into conduction, comprising:
   a current source of continuous DC current including inductive means for providing sufficient base drive current to cause a high current transistor to conduct said current source connected to the base of said high current transistor;
   switching means connected to the junction of the base of said high current transistor and said current source for alternately causing current from said current source to be diverted from the base of said high current transistor and to circulate back into said current source or to flow into said base of the high current transistor when said high current transitor is to be rendered conductive; and
   regulator means coupling a high potential source of DC to said continuous source of DC current for maintaining said DC current source at a predetermined level.

6. An efficient base drive circuit for supplying base drive current to a high current transistor from a DC source of relatively high potential comprising:

an inductor having first and second terminals;

a diode having an anode and a cathode, said cathode coupled to said first inductor terminal;

a first transistor having emitter, base and collector electrodes;

means to couple said emitter electrode of said first transistor and said anode of said diode to the negative DC source terminal;

a second transistor having emitter, base and collector electrodes;

means to couple said collector electrode of said second transistor to the junction of said first inductor terminal and said cathode of said diode;

means to couple said emitter electrode of said second transistor to the positive DC source terminal;

means to couple said second inductor terminal and said collector electrode of said first transistor to the base of said high current transistor.

7. The invention according to claim 1 further comprising:

a load serially connected between the positive DC source terminal and said collector terminal of the high current transistor together with the emitter terminal of said high current transistor being coupled to the negative terminal of the DC potential source.

* * * * *